(12) United States Patent
Chen et al.

(10) Patent No.: US 11,082,039 B2
(45) Date of Patent: Aug. 3, 2021

(54) GAN TRANSISTOR WITH INTEGRATED DRAIN VOLTAGE SENSE FOR FAST OVERCURRENT AND SHORT CIRCUIT PROTECTION

(71) Applicant: GaN Systems Inc., Ottawa (CA)

(72) Inventors: Di Chen, Kanata (CA); Larry Spaziani, Chelmsford, MA (US)

(73) Assignee: GaN Systems Inc., Ottawa (CA)

( * ) Notice: Subject to any disclaimer, the term of this patent is extended or adjusted under 35 U.S.C. 154(b) by 731 days.

(21) Appl. No.: 15/807,021

(22) Filed: Nov. 8, 2017

(65) Prior Publication Data

US 2019/0140630 A1    May 9, 2019

(51) Int. Cl.
| | |
|---|---|
| H02H 3/00 | (2006.01) |
| H03K 17/081 | (2006.01) |
| H01L 29/20 | (2006.01) |
| H01L 29/423 | (2006.01) |
| H01L 29/778 | (2006.01) |
| H03K 17/082 | (2006.01) |
| H03K 17/16 | (2006.01) |
| H01L 25/18 | (2006.01) |
| H01L 27/06 | (2006.01) |
| H01L 49/02 | (2006.01) |

(52) U.S. Cl.
CPC ... *H03K 17/08104* (2013.01); *H01L 29/2003* (2013.01); *H01L 29/42316* (2013.01); *H01L 29/7787* (2013.01); *H03K 17/0822* (2013.01); *H03K 17/163* (2013.01); *H01L 25/18* (2013.01); *H01L 27/0605* (2013.01); *H01L 27/0629* (2013.01); *H01L 28/20* (2013.01)

(58) Field of Classification Search
CPC .......... H03K 17/08104; H01L 29/2003; H01L 29/7787; H01L 29/42316
USPC ............................................................ 361/86
See application file for complete search history.

(56) References Cited

U.S. PATENT DOCUMENTS

| | | | |
|---|---|---|---|
| 5,010,385 A | 4/1991 | Shoemaker | |
| 5,467,047 A * | 11/1995 | Robb | ............... H03K 17/04123 327/108 |
| 5,621,601 A * | 4/1997 | Fujihira | .............. H01L 27/0248 361/93.9 |
| 8,803,508 B2 | 8/2014 | Nakatake | |

(Continued)

*Primary Examiner* — Jared Fureman
*Assistant Examiner* — Lucy M Thomas
(74) *Attorney, Agent, or Firm* — Miltons IP/p.i.

(57) ABSTRACT

A GaN power switching device comprises a GaN transistor switch SW_MAIN has an integrated drain voltage sense circuit, which comprises GaN sense transistor SW_SEN and GaN sense resistor $R_{SEN}$, which at turn-on form a resistive divider for sensing the drain voltage of SW_MAIN to provide a drain voltage sense output VDSEN. Fault detection logic circuitry of a driver circuit generates a fault signal FLT when VDSEN reaches or exceeds a reference voltage Vref, which triggers fast turn-off of the gate of SW_MAIN, e.g. within less than 100 ns of an overcurrent or short circuit condition. During turn-off, $R_{SEN}$ resets VDSEN to zero. For two stage turn-off, the driver circuit further comprises fast soft turn-off circuitry which is triggered first by the fault signal to pull-down the gate voltage to the threshold voltage, followed by a delay before full turn-off of the gate of SW_MAIN by the gate driver.

17 Claims, 4 Drawing Sheets

(56) References Cited

U.S. PATENT DOCUMENTS

| | | |
|---|---|---|
| 9,064,947 B2 | 6/2015 | Roberts et al. |
| 9,818,857 B2 | 11/2017 | Klowak et al. |
| 10,218,346 B1 | 2/2019 | Mizan et al. |
| 2018/0033886 A1* | 2/2018 | Mauder ................ H03K 17/102 |

* cited by examiner

GAN TRANSISTOR WITH INTEGRATED DRAIN VOLTAGE SENSE FOR FAST OVERCURRENT AND SHORT CIRCUIT PROTECTION

CROSS-REFERENCE TO RELATED APPLICATION(S)

N/A

TECHNICAL FIELD

The present invention relates to overcurrent and short circuit protection for devices and systems comprising gallium nitride (GaN) transistors, including GaN power switches, such as, high current/high voltage GaN High Electron Mobility Transistors (GaN HEMTs).

BACKGROUND ART

Fast wide bandgap semiconductor power devices, such as Silicon Carbide (SiC) or Gallium Nitride (GaN) transistors require fast short circuit and overcurrent protection (OCP). Industry standard OCP options for IGBTs (Insulated Gate Bipolar Transistors) are typically too slow for protecting faster GaN power devices. The thermal mass of a lateral GaN HEMT is small; e.g., during a short circuit or overcurrent, a lateral GaN HEMT may heat up very quickly and have a survival time of only 300 ns to 500 ns. An IGBT is typically more robust and can survive a few microseconds.

For example, the following methods for overcurrent protection are known: De-saturation detection: widely used for SiC IGBTs; however, this method of OCP is slow and may not meet the requirements for GaN devices.

Current sense resistor: a low-cost solution, but it adds parasitic inductance, which adversely affects switching performance.

Di/dt detection by voltage sensing across a common source inductance: this approach is suitable for an IGBT module but not appropriate for GaN switches in which it is desirable to minimize source inductance.

A current mirroring FET: for example, as disclosed in U.S. Pat. No. 8,803,508, a sensing cell of a power semiconductor device provides a current output to a current detection circuit; however, the disclosed solution requires a current detection circuit with a bipolar supply, in which a fast operational-amplifier and a sensing resistor are configured as a current-voltage (I/V) converter.

There is a need for improved or alternative solutions for overcurrent and short circuit protection for devices and systems comprising GaN transistors.

SUMMARY OF INVENTION

The present invention seeks to provide integrated overcurrent and short circuit protection for devices and systems comprising GaN transistors, which mitigates or circumvents one or more limitations of known solutions, or at least provides an alternative.

One aspect of the invention provides a GaN switching device comprising:
a substrate (GaN die);
a GaN transistor switch (SW_MAIN) and an integrated drain voltage sensing circuit formed on the substrate;
the GaN transistor switch SW_MAIN having a gate width Wg and on-resistance Ron, and comprising gate, source and drain terminals (GATE, SOURCE, DRAIN), a source sense terminal (KS), and the integrated drain voltage sensing circuit having a drain voltage sense terminal (VDSEN);
the integrated drain voltage sensing circuit comprising a GaN sense transistor switch (SW_SEN) having a source, drain and gate, and a GaN sense resistor (Rsen), configured to form a resistive divider, the drain of the GaN sense transistor SW_SEN being connected to the drain of the GaN transistor switch SW_MAIN, the source of the GaN sense transistor switch SW_SEN being connected through the resistor Rsen to the intrinsic source of GaN transistor switch SW_MAIN, and the gate of the GaN sense transistor switch SW_SEN being connected to the gate input of GaN transistor switch SW_MAIN; and
a node between the source of the GaN sense transistor switch SW_SEN and the resistor Rsen being connected to the drain voltage sense terminal VDSEN to provide a drain voltage sense signal from the resistive divider of the integrated drain voltage sensing circuitry,
wherein, when a gate drive signal is applied to the gate terminal to turn-on the GaN power transistor switch SW_MAIN and the GaN sense transistor switch SW_SEN, a drain voltage sense signal $V_{DSEN}$ is provided to the drain voltage terminal VDSEN.

Another aspect of the invention provides a driver circuit for a GaN power switching device (GaN die) comprising a GaN power transistor switch SW_MAIN having an integrated drain voltage sensing circuit that provides a drain voltage sense signal $V_{DSEN}$ and a driver circuit,
the driver circuit (driver chip) comprising gate driver circuitry for generating a gate drive signal having a gate drive input terminal and a gate drive output terminal; fault detection logic circuitry having a drain voltage sense terminal VPS for receiving the drain voltage sense signal $V_{DSEN}$ from the GaN switching device, and logic elements for comparing the drain voltage sense signal $V_{DSEN}$ to a reference voltage Vref and for generating a fault signal FLT of a predetermined level when $V_{DSEN}$ reaches or exceeds Vref;
the fault signal FLT being output from the fault detection logic circuitry to the gate driver circuitry, and the gate driver circuitry being configured to turn-off of the lateral GaN power switch SW_MAIN when the fault signal FLT reaches the predetermined level for overcurrent protection.

Preferably, for fast short circuit protection and overcurrent protection, parameters of the integrated drain voltage sensing circuit and the driver circuit are selected for triggering a fault signal FLT and initiating turn-off of the gate of SW_MAIN in less than 100 ns, for example, to initiate turn-off of the gate of SW_MAIN within tens of nanoseconds of a short circuit or overcurrent condition.

In some embodiments, the fast turn-off may be implemented as a one stage turn-off. For example, the FLT signal is passed through an inverter and an AND gate an input to the gate driver of driver circuit. When the FLT signal reaches the predetermined level, e.g. 5V, for overcurrent protection, the gate driver rapidly and fully turns-off the gate of the GaN transistor switch SW_MAIN. Rapid, single stage hard turn-off can be used bring the gate to source voltage Vgs to several volts below the threshold voltage, e.g. to −3V, within less than 100 ns, and preferably within 40 ns. Single stage hard turn-off may offer a solution for rapid overcurrent and short circuit protection for low current, high voltage GaN transistors comprising an integrated drain voltage sense circuit.

Advantageously, the driver circuitry further comprises fast soft turn-off circuitry to enable implementation of two-stage turn off. That is, the gate to source voltage Vgs of SW_MAIN is first rapidly pulled down to close to the threshold voltage (soft turn-off), and then after a delay Vgs is pulled down to a few volts below the threshold voltage (full or hard turn-off). For two-stage turn-off, the fault signal is passed directly, i.e. with minimal delay, to the fast soft turn-off circuitry and passed through a delay element to the gate driver. The fast soft turn-off circuitry receives the fault signal FLT, and implements fast soft turn-off when the fault signal reaches the predetermined level for overcurrent protection, e.g. 5V, followed by a delay before the gate driver receives the fault signal FLT and implements full turn-off. For example, in a first stage turn off, the fast soft turn-off circuitry initiates a rapid immediate reduction of the gate to source voltage Vgs to near or below the gate threshold voltage, from e.g. 6V to 2V within a nanosecond time period, e.g. within 40 ns. Then, there is a delay before the gate driver implements a second stage to fully turn off the gate, e.g. by bringing the gate to source voltage Vgs to −3V after a specified delay, e.g., 500 ns or 1 μs.

Two stage turn-off is beneficial for applications of devices and systems comprising high voltage/high current GaN power transistors and for lower power, low voltage GaN transistors. For example, rapid hard turn-off of a large gate width lateral GaN power transistor carrying a significant overcurrent may cause large transients and oscillations, which could potentially lead to device failure. Multi-stage turn-off, comprising fast soft turn-off followed by controlled delayed of full turn-off, assists in mitigating these issues and maintaining safe operating conditions.

The driver chip comprising the gate driver, fault detection logic circuitry and fast soft turn-off circuitry may be implemented as a low-cost silicon MOSFET driver chip.

A further aspect of the invention provides a GaN power switching module wherein the GaN power switching device comprising the integrated drain voltage sense circuitry is co-packaged with the driver circuit comprising the gate driver, fault detection logic circuitry and fast soft turn-off circuitry.

Thus, fast overcurrent and short circuit protection is provided for devices and systems comprising GaN transistors.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
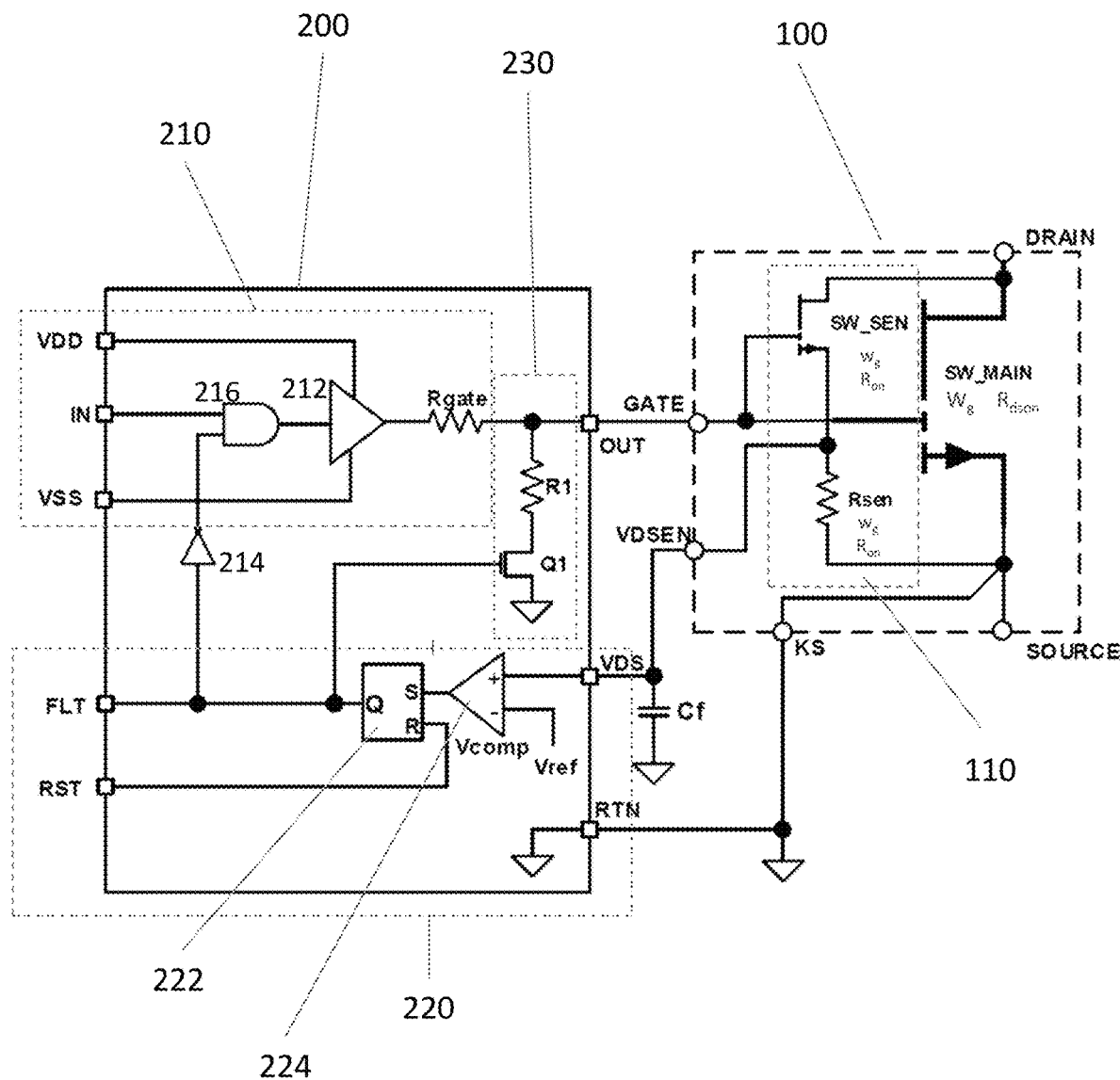
FIG. 1 shows a circuit schematic of a GaN switching module comprising a GaN transistor switch, having an integrated drain voltage sense circuit and a driver circuit, according to an embodiment of the present invention.

FIG. 1 shows a circuit schematic for a GaN switching module 10. The module 10 comprises a GaN power switching device (GaN die) 100 comprising a lateral GaN power switch (SW_MAIN) having integrated drain voltage sensing circuitry 110, connected to a driver circuit (driver chip) 200. The GaN die has drain, source, and gate terminals labelled as DRAIN, SOURCE and GATE. The GaN die also has a source sense terminal, i.e. Kelvin Source terminal (KS), and a drain voltage sense terminal (VDSEN).

The integrated drain sensing circuit 110 comprises a GaN sense transistor, SW_SEN and a GaN sense resistor Rsen, connected to SW_MAIN as illustrated in FIG. 1. The GaN sense transistor SW_SEN and GaN sense resistor Rsen have gate widths wg, the gate widths wg being selected to provide appropriate on-resistances Ron. That is, the GaN sense resistor Rsen comprises a GaN transistor, having a gate width wg, configured as a resistor. At turn-on of SW_MAIN and SW__SEN, SW_SEN and Rsen form a resistive divider for sensing a drain voltage, and the resistive divider outputs a drain voltage sense signal $V_{DSEN}$ to the drain voltage sense terminal VDSEN of the GaN die. In operation, the output drain voltage sense signal $V_{DSEN}$ is clipped by the driver circuit to a selected maximum value, e.g. a few volts, determined by a reference voltage Vref, as will be described below. During turn-off of SW_MAIN and SW_SEN, Rsen conducts and resets $V_{DSEN}$ to zero. Since SW_SEN and Rsen are integrated GaN transistor components, they have similar temperature coefficients (Tc), and the drain voltage sense signal $V_{DSEN}$ is temperature independent.

In this embodiment, the logic circuitry 220 comprises a drain voltage sense input VDS which is connected to the drain voltage sense terminal VDSEN of the GaN die. The gate return terminal RTN of the logic circuit 220 is connected to the source sense terminal KS of the GaN die. The logic circuitry 220 also comprises a fault signal terminal FLT and a reset terminal RST. The fault detection logic circuitry 220 comprises logic elements for comparing the drain voltage sense signal $V_{DSEN}$ at input VDS to a reference voltage Vref and outputting fault signal FLT of a predetermined level when the drain voltage sense signal reaches or exceeds Vref. For example, in the embodiment shown in FIG. 1, the logic circuitry 220 comprises a voltage comparator Vcomp 224 which receives the drain voltage sense signal $V_{DSEN}$ at input VDS from the drain voltage sensing circuitry 110 of the GaN die, and a reference voltage Vref. The voltage comparator compares the drain voltage sense signal $V_{DSEN}$ to the reference voltage Vref and outputs a sense signal to terminal S of the latch 222. When the drain voltage sense signal $V_{DSEN}$ reaches or exceeds Vref, the latch outputs a fault signal FLT of a predetermined level, e.g. 5V. The fault signal FLT is passed, via inverter 214 to the gate drive circuitry 210, e.g. as an input to AND gate 216, as shown in FIG. 1. The fault signal FLT is also passed directly to the fast soft turn-off circuitry 230. In this embodiment, the fast soft turn-off circuitry 230 comprises a MOSFET Q1 in series with a resistor R1. The output of the fast soft turn-off circuitry 230 is connected between the gate resistor Rgate of the gate driver circuitry 210 and the gate output OUT of the driver chip, which is connected to the gate input terminal (GATE) of the GaN die. The fault signal FLT from the latch 222 is passed directly to the gate of Q1, i.e. through a path that introduces minimal delay. When the fault signal FLT rises to a predetermined level indicative of a fault condition, e.g. 5 V, that exceeds the threshold voltage of Q1, Q1 is turned on. By appropriate selection of the value of the resistor R1, the fast soft turn-off circuitry is configured to provide fast pull-down of the gate to source voltage Vgs of SW_MAIN to close to or below the threshold voltage, e.g. pull-down from 6V to 2V, within tens of nanoseconds (fast soft turn-off). The fault signal FLT is also passed to the gate driver circuitry to fully turn-off SW_MAIN after a delay, i.e. to pull down Vgs to several volts below the threshold voltage, e.g. −3V (hard turn-off). In this way, the driver circuitry implements a rapid two-stage turn off.

In the absence of the fast soft turn-off circuitry 230, the fault signal FLT passed to the gate driver 210 would implement rapid and full turn-off of the gate of the GaN switch SW_MAIN. Since, the inverter 214 and other logic elements of the gate driver circuitry inherently add some delay, when the FLT signal is passed to both the gate driver 210 and the fast soft turn-off circuitry 230, this arrangement provides for a two-stage turn off. That is, in first stage of turn-off, the fast soft turn-off circuitry 230 rapidly pulls down the gate of the GaN switch SW_MAIN to a level close to or below the threshold voltage (stage 1, fast soft-turn off). Then, after a planned delay, Vgs is pulled down to a few volts than the threshold voltage (stage 2, full or hard turn-off).

The driver circuit design and layout, e.g. placement of elements of the logic circuitry 220 and soft fast turn-off circuit 230 are configured to provide minimal delay in generating and passing the fault signal FLT to the soft fast turn-off circuit 230 for initiating soft pull-down of the gate voltage Vgs of SW_MAIN, e.g. placement of circuitry 230 is close to the gate OUT pin of the driver circuit, so that the first stage of switching can be initiated on a time scale of less than 100 ns, and preferably within tens of nanoseconds. The values of the resistor R1 of the fast soft turn-off circuitry 230 and the gate resistor Rgate of the gate driver, and the ratio of R1 to Rgate, and other parameters of the gate driver 210 and fast soft turn-off circuitry 230 are selected to control the speed and timing of the first and second stages of switching, and the voltage to which the fast soft turn-off circuit pulls down the gate during the fast soft-switching stage. While the inverter 214 inherently provides some delay in passing the fault signal FLT to the gate driver 210, when it is required to provide a specific delay, e.g. 300 ns to 2 μs, before initiating the second stage of turn-off, a delay element may be inserted between the logic circuit 220 and the gate driver 210.

Two stage fast turn-off is advantageous for devices and systems comprising high voltage/high current GaN transistors such as large area lateral GaN HEMTs. In the absence of the fast soft turn-off circuitry 230, for example, if the GaN switch is a high voltage, high current GaN power transistor, in the event of overcurrent, a rapid and full (hard) turn-off of the gate of SW_MAIN to −3V by the gate driver 210 may result in significant transients or oscillations, and unstable operation, which could potentially lead to device failure or unsafe operation conditions. Rapid soft pull-down to close to the threshold voltage by the fast soft turn-off circuitry 230, followed by delayed hard turn-off by the gate driver 210 assists in mitigating these issues and maintaining safe operating conditions. As illustrated in FIG. 1, a filter element such as capacitor Cf may be included to filter out noise in the drain voltage sense signal $V_{DSEN}$ resulting from rapid turn-off/turn-on.

For both small and large GaN transistors, when short circuit occurs, the current spike will be much higher than normal operating current (only limited by device saturation), so a high voltage spike can be present. For lower power, low voltage GaN transistors, a Vds spike could be even more harmful, because the device has less voltage margin than high voltage GaN transistors. Thus, two stage turn-off, in which the fast soft turn-off circuitry operates to bypass the gate driver control logic, offering a faster reaction time to initiate soft turn-off within tens of nanonseconds, to mitigate this issue.

In devices and systems comprising low current, high voltage GaN transistors, it may be possible that single stage fast turn-off is acceptable. In this case, the fast soft turn-off circuitry 230 may be omitted. In such embodiments, the logic circuit is configured to provide the fault signal FLT to the gate driver, with minimal delay, to initiate fast turn-off within a required time period, e.g. less than 100 ns. However, two-stage turn-off as described above offers a faster reaction time.

EXAMPLE

OCP for Large Area, High Voltage/High Current GaN E-HEMT with Integrated Drain Voltage Sense The operation of the system illustrated in FIG. 1 will be described in more detail, by way of example, with reference to simulation results based on a lateral GaN power switch SW_MAIN, which comprises a large area, large gate width lateral GaN E-HEMT. Simulation results for a GaN E-HEMT in the form of a 650V/50 mΩ device which has a gate width Wg=300 mm and a drain-source on-resistance, Rdson, of 50 mΩ are shown in FIGS. 2 to 4.

It is desirable that the drain voltage sensing circuit 110 takes up minimal space on the GaN die 100 and that SW_SEN and Rsen are small enough so that they carry a small proportion of the current carried by the GaN switch SW_MAIN, for example, a current of only tens of mA. On the other hand, since Rsen is part of the SW_SEN gate drive loop that controls or limits the switching speed of SW_SEN, the gate widths wg of SW_SEN and Rsen should be large enough provide an on-resistance Ron in the range of about 20Ω to 60Ω. For example, the GaN sense transistor SW_SEN and GaN sense resistor Rsen have a size of about 1:500, or less, relative to SW_MAIN. For the simulation, SW_SEN has a gate width wg=0.6 mm and an on-resistance Ron of 25Ω and SW_SEN is connected to a GaN sense resistor Rsen, having the same gate width and on-resistance. In practice, the gate width wg and on-resistance Ron of SW_SEN and Rsen need not be the same.

Figure 2:
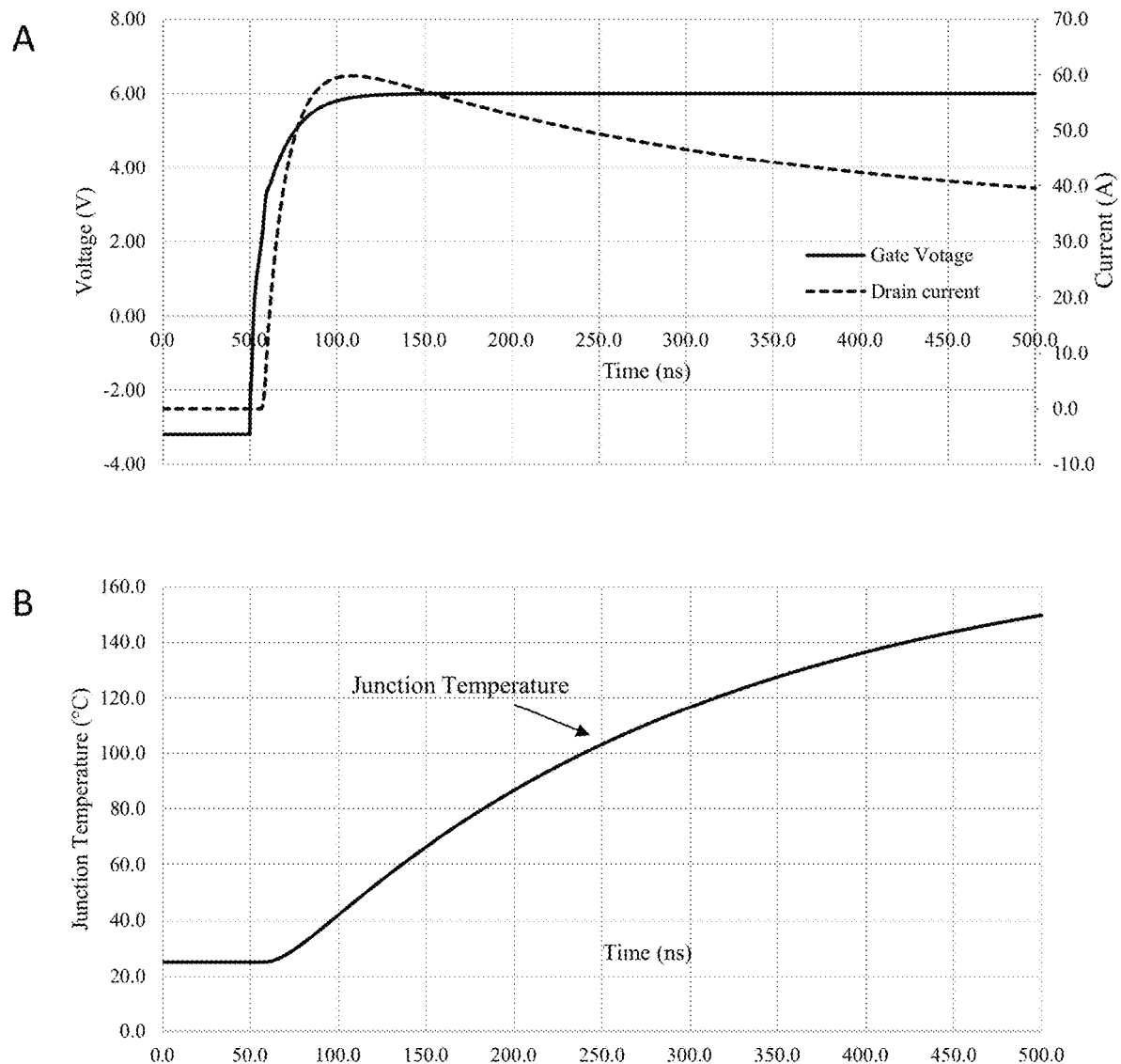
FIG. 2 shows simulation results for a short circuit test at 400V for an example of a GaN switching device comprising a large area lateral GaN power transistor, without implementing overcurrent protection.

Referring to FIG. 2, in simulation of a short circuit test at 400V for a large scale GaN E-HEMT (Wg=300 mm and Rdson=50 mΩ) without implementation of overcurrent protection (OCP), the upper plot A shows the gate voltage Vgs vs. time and the drain current ID vs. time on a nanosecond time scale. Under short circuit conditions, when the gate voltage Vgs rises above the threshold voltage to turn on the GaN switch SW_MAIN, the drain current Id rapidly rises to over 60 A, within about 100 ns. The lower plot B shows the junction temperature $T_J$ vs. time, on the same nanosecond time scale. $T_j$ increases to over 150 C after about 400 ns.

Figure 3:
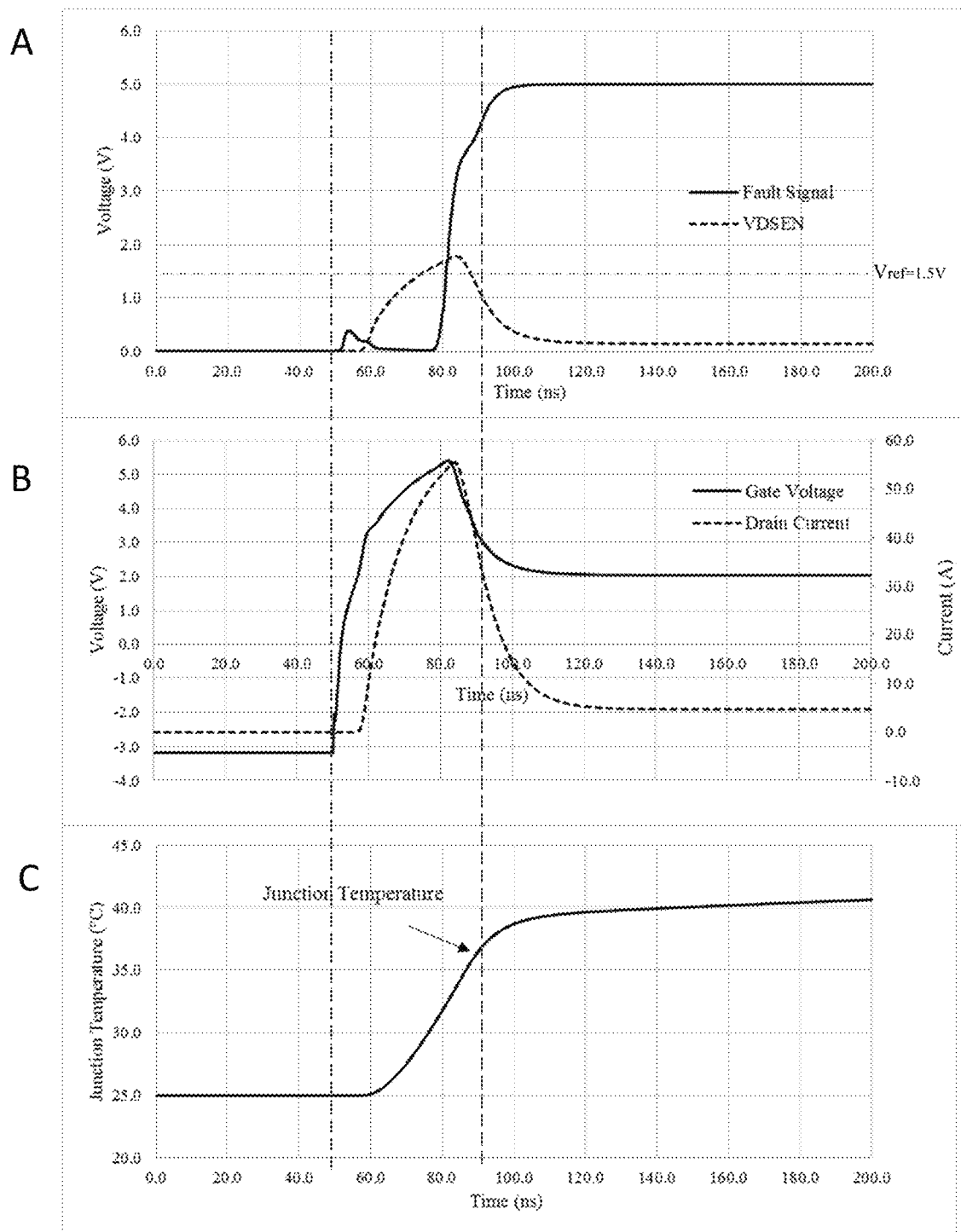
FIG. 3 shows simulation results for a short circuit test at 400V for an example of a GaN switching device comprising a large area lateral GaN power transistor having an integrated drain voltage sense circuit, with implementation of overcurrent protection.
Figure 4:
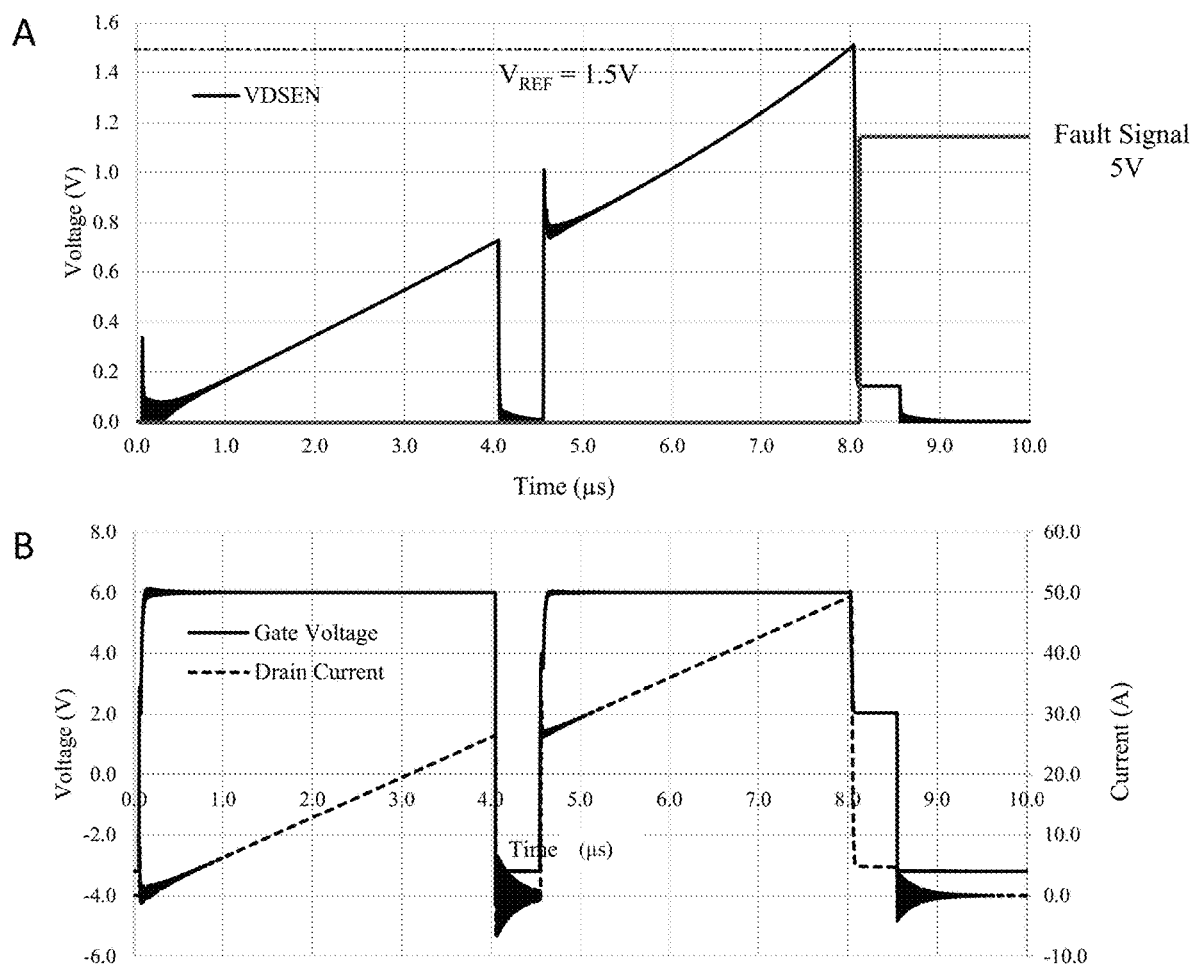
FIG. 4 shows additional simulation results for implementation of overcurrent protection.

In simulation results for OCP implemented for a large scale GaN E-HEMT (Wg=300 mm and Rdson=50 mΩ) comprising the integrated drain voltage sensing circuit of the embodiment shown in FIG. 1, referring to FIG. 3, the upper plot A shows the rise in drain sense voltage VDSEN and the corresponding latch output fault signal FLT as a function of time, when the SW_MAIN is turned on under a short circuit condition. That is, as VDSEN rises and exceeds the reference voltage Vref, which in this example is 1.5V, the fault detection circuitry is triggered to output a fault signal FLT of 5V. The middle plot B shows corresponding values for the gate voltage VGS and drain current ID vs. time, showing that the GaN switching device is turned off softly within 40 ns of short circuit. That is, the gate voltage VGS is dropped to 2V, i.e. below the threshold voltage, over a time period of about 10 ns to 20 ns, to turn off the GaN switch SW_MAIN, which rapidly limits the drain current. Fast and soft turn-off of the device effectively limits the rise in $T_j$, i.e. to about 40 C, as illustrated in the lower plot C. Full turn-off to −3V can then be delayed by e.g. by 500 ns or more.

Further simulation results are shown in FIG. 4. The upper plot A shows the gate sense voltage VDSEN, the fault output voltage FLT, and reference voltage Vref, as a function of time on a microsecond time scale. In this example, Vref=1.5V. The lower plot B shows the corresponding gate voltage $V_{GS}$ and drain current ID through several switching cycles. The drain sense voltage VDSEN increases as the drain current ID increases. As illustrated in the upper plot A, the fault output signal level FLT remains near 0V until the drain sense voltage VDSEN reaches and exceeds the reference voltage Vref=1.5V, at which time the latch circuit triggers an increase in the fault output signal level FLT, e.g. to a predetermined level such as 5V, which exceeds the threshold voltage of transistor Q1, activating the soft turn-off circuit. In this example, the turn-off is shown as implemented with a 2-level soft turn-off, which, when Q1 is turned on, brings the gate voltage Vgs rapidly down to 2V, i.e. below the threshold voltage, within ~50 ns. Since the fault signal FLT is also input to the gate driver circuitry 210, about 0.5 μs (500 ns) later, the gate driver circuitry 210 is configured to bring the gate voltage Vgs down to −3V to fully turn off the GaN switch SW_MAIN.

Thus, a fast OCP control circuit for a GaN power switch is provided utilizing an integrated GaN drain voltage sense circuit and a driver circuit comprising fault detection logic elements, such as a comparator and a latch, configured for generating a fault signal FLT for triggering a soft turn-off circuit which operates on a nanosecond time scale. When the drain voltage sense output VDSEN exceeds a reference voltage Vref, the logic circuitry outputs a fault signal FLT exceeding the threshold voltage of transistor Q1, e.g. 5V, to turn-on the fast soft turn off circuitry 230. Simulation results for this circuit arrangement shows that turn-off can be implemented in a time frame of about 40 ns, which is fast enough to limit the rise in $T_j$ and prevent overheating of the lateral GaN power switch in a short-circuit or overcurrent condition. This circuit offers good potential to address the short-circuit survival time, e.g. 300 ns to 500 ns, for GaN HEMTs. A second stage, full turn-off of the GaN switch SW_MAIN can be delayed, e.g. for 300 ns to 2 μS.

While a specific embodiment has been described in detail above, with reference to the figures, and by way of example, it will be appreciated that modifications and variations of the embodiment may be made. Simulation results are based on one example of a large area, large gate width lateral GaN power transistor. These simulation results are also provided by way of example only. Specific values of components, e.g. gate widths of the GaN transistors, resistor and capacitor values, et al., are shown by way of example only. For a large scale GaN power switch SW_MAIN, the relative sizes and parameters of the integrated GaN sense transistor SW_SEN and GaN sense resistor Rsen of the drain voltage sensing circuitry, and the reference voltage Vref for the logic circuit and other parameters of the driver circuitry and soft turn-off circuitry, are selected to provide appropriate timing for implementation of fast turn-off under short circuit or overcurrent conditions, e.g. within 100 ns, and preferably within 50 ns or less.

For example, for a large area, high voltage/high current GaN power switch, the gate widths of the sense transistor SW_SEN and the sense resistor Rsen are sized with a ratio in a range of about one to several hundreds (1:~100) to one to about one to one thousand (1:~1000), e.g. 1:500 relative to the values for the lateral GaN power switch SW_MAIN. The gate widths $w_g$ of the GaN sense transistor SW_SEN and the GaN sense resistor RSEN are sized to be small enough that they carry a maximum current of only tens of mA. As the sense resistor Rsen is part of the sensing circuitry which controls or limits the switching speed of the sense transistor SW_SEN, the gate widths $w_g$ of Rsen and SW_SEN sized to be are large enough to provide an $R_{on}$ in the range of about 20 to 60Ω. Preferably, the integrated sense circuitry provides for generating the drain voltage sense output VDSEN to enable fast and soft turn off within 100 ns, and more preferably within tens of nanoseconds, e.g. ~50 ns or less. The resulting turn-off time is then well below an expected 300 ns to 500 ns survival time of the lateral GaN power switch SW_MAIN.

In the logic circuit 220 generating the fault signal FLT, the reference voltage Vref is selected to be a suitable level, e.g., 1.5 V or 2.5V, so that when VDSEN approaches Vref, the latch operates within an appropriate time frame to generate the required fault signal level, e.g. 5V or 6V to turn on the MOSFET Q1 of the fast soft turn-off circuity and initiate fast turn-off of the gate of SW_MAIN. The value of the resistor R1 of the fast soft turn-off circuitry and the gate resistor Rgate of the gate driver circuitry, and the ratio R1/Rgate are selected to control the timing and voltage level of the fast soft turn-off stage. The fault signal output of the latch 222 is routed with minimal delay to the fast soft turn-off circuitry to enable the first stage of turn-off within tens of nanoseconds.

If the fast soft turn-off circuitry 230 is omitted or not activated, the fast turn-off is implemented as a one-step fast turn off, i.e. when the fault signal level FLT indicative of a fault condition is received by the gate driver circuitry, and fed to the gate driver circuitry through inverter 214, the gate driver 210 will rapidly and fully turn-off SW_MAIN.

It is desirable that the integrated GaN elements of the drain voltage sense circuitry 110 occupy only a small part of the active area of the GaN die 100. For example, for a GaN die comprising a large gate width Wg, high current/high voltage lateral GaN power transistor, the drain voltage sensing circuitry 110 comprises a GaN sense transistor SW_SEN and GaN sense resistor of the voltage divider which have a relatively small gate width wg, e.g. wg/Wg=1: 500 or less. This means that the sense circuitry takes a small percentage of the current. On the other hand, the gate width wg must be large enough to provide an on-resistance Ron in the range of about 20Ω to 60Ω, since Ron is one of the parameters that controls the gate switching speed. If Ron of the sense transistor and sense resistor are too large, the drain voltage sensing circuitry will be too slow in responding to an overcurrent. For a large gate width high current/high voltage lateral GaN power transistors, a gate width ratio wg/Wg in the range of 1:500 or 1:1000, or even 1:2000 may provide acceptable performance, while the integrated drain voltage sense circuitry takes up minimal area on the GaN die.

For small gate width, low voltage GaN transistor switches, the gate width wg of the sense transistor SW_SEN and sense resistor Rsen must be large enough to provide an on-resistance in the appropriate range. That is for a small gate width GaN transistor, while it is desirable that the voltage divider takes up a minimal area of the GaN die, a ratio of wg/Wg of 1:500 or less may not provide sufficient gate width to provide the required on-resistance. Thus, for a smaller gate width, low voltage GaN transistor switch, a ratio of wg/Wg in the range of ~1:100 to ~1:10 may be required. In the latter example, the integrated drain voltage sense circuit for a small gate width GaN transistor switch takes up a larger percentage of the active area of the GaN die.

In some embodiments, single stage fast hard turn-off may be acceptable. However, in operational conditions where single stage hard turn-off may result in significant transients, the fast soft turn-off circuitry is configured to implement two stage turn-off. For example, a two stage turn-off, comprises an immediate reduction of Vgs below the gate threshold voltage, from e.g. 6V to 2V within ~40 ns or less, followed by fully turning off the gate to e.g. ~3V after a short delay (e.g. 300 ns to 1 μs), as illustrated in FIG. 4, plot B. The timing of the multi-level turn-off is controlled by parameters of the driver circuitry which includes the parameters of driver circuitry 210 and the fast soft turn-off circuitry 230, both of which receive the fault signal FLT. The fast soft turn-off circuitry 230 is shown in FIG. 1, by way of example, as a comprising single transistor Q1 and resistor R1, in which the fault signal FLT is passed from the output of the latch 222 directly to the gate of Q1, i.e. for fast soft turn-off, there is minimal delay introduced between the output of the fault detection logic circuitry and the gate of Q1. Parameters of the driver circuit 210 and the fast soft turn-off circuitry 230 that can be selected by the circuit designer to control first and second stage turn-off include the values of resistors R1, Rgate, the ratio of R1/Rgate, the reference voltage Vref and delay between the fault detection logic circuitry 230 and the gate driver 210.

Although embodiments of the invention have been described and illustrated in detail, it is to be clearly understood that the same is by way of illustration and example only and not to be taken by way of limitation, the scope of the present invention being limited only by the appended claims.

The invention claimed is:
1. A GaN power switching device comprising:
a semiconductor die substrate;
a GaN integrated circuit comprising a power transistor switch SW_MAIN and an integrated drain voltage sensing circuit formed monolithically on the semiconductor die substrate;
the power transistor switch SW_MAIN having a gate width Wg and on-resistance Rdson, and comprising gate, source and drain terminals, a source sense terminal, and the integrated drain voltage sensing circuit having a drain voltage sense terminal;
the integrated drain voltage sensing circuit comprising a sense transistor switch SW_SEN and a sense resistor $R_{SEN}$, configured to form a resistive divider, wherein the sense transistor switch SW_SEN comprises a source, a drain and a gate, a gate width wg and on-resistance Ron, and the sense resistor comprises a transistor configured as a resistor having a gate width wg and on-resistance Ron;
the drain of the sense transistor switch SW_SEN being connected to the drain of the power transistor switch SW_MAIN, the source of the sense transistor switch SW_SEN being connected through the sense resistor $R_{SEN}$ to an intrinsic source of the power transistor switch SW_MAIN, and the gate of the sense transistor switch SW_SEN being connected to the gate terminal of the power transistor switch SW_MAIN; and a node between the source of the sense transistor switch SW_SEN and the sense resistor $R_{SEN}$ of the resistive divider being connected to the drain voltage sense terminal,
wherein, when a gate drive signal is applied to the gate terminal to turn-on the power transistor switch SW_MAIN and the sense transistor switch SW_SEN, a drain voltage sense signal $V_{DSEN}$ is provided to the drain voltage sense terminal.

2. The GaN power switching device of claim 1, wherein the power transistor switch SW_MAIN comprises a large gate width, high voltage/high current lateral power transistor, and the sense transistor switch SW_SEN and the sense resistor $R_{SEN}$ are lateral transistors, wherein the gate width ratio wg/Wg is in the range from about 1:100 to 1:1000.

3. The GaN power switching device of claim 2, wherein the gate widths wg of the sense transistor switch SW_SEN and the sense resistor $R_{SEN}$ are selected to provide an on-resistance Ron in a range from 20Ω to 60Ω.

4. The GaN power switching device of claim 3, wherein the gate widths wg of the sense transistor switch SW_SEN and the sense resistor $R_{SEN}$ are different.

5. A driver circuit for a GaN power switching device comprising a power transistor switch SW_MAIN and an integrated drain voltage sensing circuit as defined in claim 1, the driver circuit comprising:
gate driver circuitry for generating a gate drive signal, having a gate drive input terminal and a gate drive output terminal; fault detection logic circuitry having a terminal for receiving a drain voltage sense signal $V_{DSEN}$ from the GaN switching device, and logic elements for comparing the drain voltage sense signal $V_{DSEN}$ to a reference voltage Vref and generating a fault signal FLT of a predetermined level when $-V_{DSEN}$ reaches or exceeds Vref; the fault signal FLT being input to the gate driver circuitry to turn-off the power transistor switch SW_MAIN when the fault signal FLT reaches the predetermined level for overcurrent protection.

6. The driver circuit of claim 5, further comprising fast soft turn-off circuitry connected directly to the gate output terminal of the driver circuit, the fast soft turn-off circuitry configured to receive the fault signal FLT from the fault detection logic circuitry and implement fast soft turn-off of the power switch SW_MAIN when the fault signal FLT reaches the predetermined level for overcurrent protection, before full turn-off of the power switch SW_MAIN by the gate driver circuitry.

7. The driver circuit of claim 6, wherein the fast soft turn-off circuitry comprises a transistor Q1 and resistor R1, and the fault signal FLT output of the fault detection logic circuitry is connected to the gate of Q1, whereby when the fault signal level reaches the predetermined level for overcurrent protection which exceeds the threshold voltage of transistor Q1, transistor Q1 is turned on to pull-down the gate voltage Vgs of the GaN power switch SW_MAIN to near or below its threshold voltage, within less than 100 ns.

8. The driver circuitry of claim 6, wherein
the fast soft turn-off circuitry comprises a transistor Q1 and resistor R1,
the output of the fault detection logic circuitry is connected directly to the gate of transistor Q1 of the fast soft turn-off circuitry and connected through a delay element comprising an inverter to an input of the gate driver circuitry,
parameters of the gate driver circuitry and the fast-soft turn off circuitry comprising values of a gate resistor Rgate and the resistor R1, the ratio of values of R1/Rgate being configured to implement a two stage turn-off, wherein when the fault signal output FLT of the logic circuitry exceeds the predetermined level for overcurrent protection, Q1 is turned on and the fast soft turn-off circuitry implements fast soft turn-off of the gate of the power transistor switch SW_MAIN, and the gate driver circuitry implements hard turn-off of the gate of the power transistor switch SW_MAIN after a specified delay.

9. The driver circuitry of claim 8, wherein fast soft turn-off by the fast soft turn-off circuitry comprises pull-down of the gate to source voltage Vgs of the power transistor switch SW_MAIN to near or below its threshold voltage within tens of nanoseconds, and wherein hard turn-off comprises pull down of Vgs to several volts below the threshold voltage, and the specified delay is in the range of 100 ns to 2 µs.

10. The driver circuitry of claim 8, wherein the fast soft-turn off by the fast soft turn-off circuitry comprises pull-down of the gate to source voltage Vgs of the power transistor switch SW_MAIN to a lower Vgs above the threshold voltage within tens of nanoseconds, and wherein full turn-off comprises pull-down of Vgs to below the threshold voltage, and the specified delay is in the range of 100 ns to 2 µs.

11. The GaN power switching device of claim 1, wherein the GaN power transistor switch SW_MAIN comprises a large gate width, high voltage/high current power transistor, and wherein the gate width ratio wg/Wg is in the range from about 1:100 to 1:1000.

12. The GaN power switching device of claim 1, wherein the power transistor switch SW_MAIN, the sense transistor switch SW_SEN, and the sense resistor $R_{SEN}$ are lateral transistors.

13. The GaN power switching device of claim 1, wherein the gate width wg of the sense transistor switch SW_MAIN and the gate width wg of the sense resistor $R_{SEN}$ of the resistive divider are selected to provide said on-resistances Ron in a range from 20Ω to 60Ω, to provide fast sensing of a drain-source voltage $V_{DS}$ of the power transistor switch, to provide the drain voltage sense signal $V_{DSEN}$ within less than 100 ns.

14. A GaN power switching module comprising:
a GaN power switching device comprising:
a semiconductor die substrate;
a GaN integrated circuit comprising a power transistor switch SW_MAIN and an integrated drain voltage sensing circuit, formed monolithically on the semiconductor die substrate;
the power transistor switch SW_MAIN having a gate width Wg and on-resistance Rdson, and comprising gate, source and drain terminals and a source sense terminal, and the integrated drain voltage sensing circuit having a drain voltage sense terminal;
the integrated drain voltage sensing circuit comprising a sense transistor switch SW_SEN and a sense resistor $R_{SEN}$ configured as a resistive divider, the sense transistor switch having a source, a drain and a gate, a gate width wg and an on-resistance Ron, and the sense resistor $R_{SEN}$ comprising a transistor configured as a resistor, having a gate width wg and an on-resistance Ron,
the drain of the sense transistor switch SW_SEN being connected to the drain of the power transistor switch SW_MAIN, the source of the sense transistor switch SW_SEN being connected through the sense resistor $R_{SEN}$ to an intrinsic source of the power transistor switch SW_MAIN, and the gate of the GaN sense transistor switch SW_SEN being connected to the gate of the power transistor switch SW_MAIN;
and a node between the source of the sense transistor switch SW_SEN and the sense resistor $R_{SEN}$ of the resistive divider being connected to the drain voltage sense output terminal; and
a driver circuit comprising:
gate driver circuitry for generating a gate drive signal, having a gate drive input terminal and a gate drive output terminal; fault detection logic circuitry having a terminal for receiving a drain voltage sense signal $V_{DSEN}$ from the drain voltage sense terminal of the GaN power switching device, and logic circuitry for comparing the drain voltage sense signal $V_{DSEN}$ to a reference voltage Vref and generating a fault signal FLT of a predetermined level when $V_{DSEN}$ exceeds Vref; and the fault signal FLT being input to the gate driver circuitry to turn-off of the gate of the power switch SW_MAIN when the fault signal FLT reaches the predetermined level for overcurrent protection.

15. The GaN power switching module of claim 14, wherein the driver circuit comprises a MOSFET driver circuit which is co-packaged with the GaN power switching device.

16. The GaN power switching module of claim 14, configured to implement turn-off comprising first and second stage turn-off, wherein
the driver circuit comprises fast soft turn-off circuitry connected directly to the gate output terminal of the driver circuit, the fast soft turn-off circuitry configured to receive the fault signal FLT from the fault detection logic circuitry and provide the first stage turn-off comprising fast soft turn-off of the power transistor switch SW_MAIN when the fault signal FLT reaches the predetermined level for overcurrent protection, and then implement the second stage turn-off comprising full turn-off of the GaN power transistor switch SW_MAIN by the gate driver circuitry.

17. The GaN power switching module of claim 16, wherein the fast soft-turn off by the fast soft turn-off circuitry comprises pull-down of the gate to source voltage Vgs of the power transistor switch SW_MAIN to a lower Vgs above the threshold voltage within tens of nanoseconds, and wherein full turn-off comprises pull down of Vgs to below the threshold voltage, and the specified delay is in the range of 100 ns to 2 µs.

* * * * *

UNITED STATES PATENT AND TRADEMARK OFFICE
CERTIFICATE OF CORRECTION

PATENT NO. : 11,082,039 B2  
APPLICATION NO. : 15/807021  
DATED : August 3, 2021  
INVENTOR(S) : Di Chen and Larry Spaziani Page 1 of 1

It is certified that error appears in the above-identified patent and that said Letters Patent is hereby corrected as shown below:

In the Specification

Column 2, Line 18: "voltage sensing circuitry," should read -- voltage sending circuit, --

Column 2, Line 33: "VPS for receiving" should read -- VDS for receiving --

Column 5, Line 39: "e.g. 300 ns" should read -- e.g. 500 ns --

Column 12, Line 11: "gate of the GaN sense" should read -- gate of the sense --

Signed and Sealed this  
Twenty-seventh Day of December, 2022

Katherine Kelly Vidal  
*Director of the United States Patent and Trademark Office*